(12) United States Patent
Blumberg et al.

(10) Patent No.: US 6,724,056 B1
(45) Date of Patent: Apr. 20, 2004

(54) FIELD-EFFECT TRANSISTORS WITH HIGH-SENSITIVITY GATES

(75) Inventors: Girsh Blumberg, New Providence, NJ (US); Peter B. Littlewood, Cambridge (GB)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/413,966

(22) Filed: Apr. 15, 2003

(51) Int. Cl.⁷ ............................................... H01L 29/76
(52) U.S. Cl. .................................. 257/410; 257/405
(58) Field of Search ............................... 257/410, 411, 257/402, 405, 406

(56) References Cited

U.S. PATENT DOCUMENTS

| | | | |
|---|---|---|---|
| 4,580,110 A | 4/1986 | Bhattacharya et al. | 332/16 R |
| 4,636,737 A | 1/1987 | Bhattacharya et al. | 329/110 |
| 5,418,389 A | * 5/1995 | Watanabe | 257/295 |
| 5,572,052 A | 11/1996 | Kashihara et al. | 257/295 |
| 5,906,963 A | 5/1999 | Simon et al. | 505/190 |
| 6,083,765 A | 7/2000 | Tempel | 438/3 |
| 6,144,546 A | 11/2000 | Mizushima et al. | 361/303 |
| 6,297,200 B1 | 10/2001 | Simon et al. | 505/238 |

OTHER PUBLICATIONS

U.S. patent application Ser. No. 10/043,372, Blumberg et al., filed Jan. 9, 2002.
U.S. patent application Ser. No. 10/159,449, Blumberg et al., filed May 31, 2002.
Siegrist, T. et al., *A New Layered Cuprate Structure–Type*, $(A_{1-x}-A'_x)_{14}CU_{\geq}O_{41}$, Mat. Res. Bull. 1988, vol. 23, pp. 1429–1438.
McCarron, E.M. III et al., *The Incommensurate Structure of $(Sr_{14-x}Ca_x)C_{u24}O_{41}$ ($0<x-8$), A Superconductor Byproduct*, Mat. Res. Bull., 1988, vol. 23, pp. 1355–1365.

Kimura, S., Shindo, I., *Single Crystal Growth of YIG by the Floating Zone Method*, Journal of Crystal Growth 41 (1977), pp. 192–198.
Strobel, P. et al., *Crystal Growth and Characterization of the Superconducting Phase in the Bi–Sr–Cu–O System*, Physical C 156 (1988), pp. 434–440.
Kitano, H., et al., *Microwave and millimeter wave spectroscopy in the slightly hole–doped ladders of $Sr_{14}Cu_{24}O_{41}$*, Aug. 14, 2001, arXiv:cond–mat/0108222, 7 pages.
Motoyama, N., Osafune, T., Kakeshita, T., Eisaki, H., Uchida, S., *Effect of Ca substitution and pressure on the transport and magnetic properties of $Sr_{14}Cu_{24}O_{41}$ with doped two–leg Cu–O ladders*, Physical Review B, Feb. 1, 1997, vol. 55, No. 6, pp. R3386–R3389.
Tanaka, I., Kojima, H., *Superconducting single crystals*, Jan. 5, 1989, Nature vol. 337, pp. 21, 22.
Ramirez, A.P., Subramanian, M.A., Gardel, M., Blumberg, G., Li, D., Vogt, T., Shapiro, S.M., *Giant dielectric constant response in a copper–titanate*, Solid State Communications 115 (2000), pp. 217–220.
Osafune, T., Motoyama, N., Eisaki, H., Uchida, S., *Optical Study of the $Sr_{14-x}Cu_{24}O_{41}$ System; Evidence for Hold–Doped $Cu_2O_3$ Ladders*, Mar. 10, 1997, Physical Review Letters, vol. 78, No. 10, pp. 1980–1983.

(List continued on next page.)

Primary Examiner—Sara Crane
(74) Attorney, Agent, or Firm—John F. McCabe

(57) ABSTRACT

A field-effect transistor (FET) includes a source electrode, a drain electrode, a gate electrode, a gate dielectric, and a semiconductor layer that functions as an active channel of the transistor. The active channel is configured to carry a current between the source and drain electrodes and has a conductivity responsive to voltages applied the gate electrode. The gate dielectric is located between the gate electrode and the semiconductor layer and includes a quasi-1D charge or spin density wave material.

17 Claims, 4 Drawing Sheets

OTHER PUBLICATIONS

McElfresh, M.W., Coey, J.M.D., Strobel, P., von Molnar, S., *Electronic properties of $Sr_{14}Cu_{24}O_{41}$*, Physical Review B, Jul. 1, 1989, vol. 40, No. 1, pp. 825–828.

Gozar, A. et al., *Spin dynamics of $Sr_{14}Cu_{24}O_{41}$ two–ladder studied by Raman spectroscopy*, Phys. Rev. Lett., vol. 87, No. 19, Nov. 5, 2001, pp. 197202–1 to 197202–4.

Littlewood, P.B., *Screened dielectric response of sliding charge–density waves*, Physical Review B, vol. 36, No. 6, Aug. 15, 1987, pp. 3108–3116.

Littlewood, P.B., *Bistability of Non–Linear Conductivity in Insulators with Sliding Charge Density Waves*, Solid State Communications, vol. 65, No. 11, 1998, pp. 1347–1350.

Gruner, George: *Density Waves in Solids*, (Addison–Wesley Publishing Company, 1994), Ch. 2, pp. 15–30; Ch. 8, pp. 150–163; ch. 9, pp. 164–181; Ch. 10, pp. 182–197.

Blumberg, G, Littlewood, P., Gozar, A., Dennis, B.S., Motoyama, N., Eisaki, H., Uchida, S., *Sliding Density Wave in $Sr_{14}Cu_{24}O_{41}$ Ladder Compounds*, Science, 26, Jul. 2002, vol. 297, pp. 584–587.

Yutaka Furubayashi, Takahito Terashima. Iksu Chong, and Mikio Takano, *Epitaxial growth of single–crystalline thin film of $Ca_{14}Cu_{24}O_{41}$: A heavily hole–doped two–legged spin ladder*, Physical Review B, Aug. 1, 1999, vol. 60, No. 6, pp. R3720–R3723.

Sugii, et al., "Growth of $Sr_{1-x}Nd_xCuO_y$ thin films by RF–magnetron sputtering and their crystallographic properties," Physica C 196, (1992), pp. 129–134.

Dorger, M., et al., "Room temperature charge transfer in two–leg cuprate ladder compounds," Physica C 341–348 (2000), pp. 477–478.

Lagues, M., et al., "Transport properties of MBE grown Cuprate Spin Ladders," Physica C 282–287 (1997), pp. 162–165.

Koster, G., et al., Abstract for "Superconductivity and Its Applications," Physica C353 (3–4): 167–183, May 15, 2001, published on ISI Web of Science (2001), 1 page.

Kojima, K.M., et al., Abstract for "The electronic properties of cuprate ladder materials," Journal of Electron Spectroscopy and Related Phenomena, 117: 237–250, Jun. 2001, published on ISI Web of Science (2001), 1 page.

Vuletic, T., et al., "Suppression of the Charge–Density–Wave State in $Sr_{14}Cu_{24}O_{41}$ by Calcium Doping," Physical Review Letters, vol. 90, No. 25, pp. 257002–1 to 257002–4, Jun. 27, 2003.

Gozar, A., et al., "Collective Density–Wave Excitations in Two–Leg $Sr_{14-x}CA_xCu_{24}O_{41}$ Ladders," Physical Review Letters, vol. 91, No. 8, pp. 087401–1 to 087401–4, Aug. 22, 2003.

\* cited by examiner

FIELD-EFFECT TRANSISTORS WITH HIGH-SENSITIVITY GATES

BACKGROUND

1. Field of the Invention

This invention relates to field-effect transistors.

2. Discussion of the Related Art

One of the most important electronic devices is the field-effect-transistor (FET). A FET has a source electrode, a drain electrode, and an active semiconductor channel for carrying a current between the source and drain electrodes. In the FET, the current flow in the active semiconductor channel is controlled through the channel conductivity. In particular, the FET includes a gate structure for producing an electric field to vary the conductivity of the active semiconductor channel. The gate structure includes a gate electrode and a gate dielectric for electrically insulating the gate electrode from the channel.

The configuration of the gate dielectric determines, in part, the strength of the electric field that a particular gate voltage will produce at the semiconductor channel. Some gate dielectrics have a configuration that causes a small change in gate voltage to produce a large change in the strength of the electric field applied to the active semiconductor channel. These gate structures have high sensitivities and are desirable in many FET applications.

One way to produce a high sensitivity gate structure involves making the gate dielectric from a very thin layer. Contemporary layers for gate dielectrics are rapidly approaching the minimum thickness for an electrical insulating layer. Thus, other ways for making a gate structure with a high sensitivity are desirable.

SUMMARY

Various embodiments provide field-effect-transistors (FETs) in which a quasi-one-dimensional (1D) material functions as a gate dielectric. The quasi-1D material has a dielectric constant with a larger real part at low and moderate gate operating frequencies. The high value of the real part of the dielectric constant makes the gate structure ultra-sensitive. The new gate dielectric can be either a thin layer or a layer that is significantly thicker than conventional layers for gate dielectrics.

In one aspect, the invention features a field-effect transistor (FET) having a source electrode, a drain electrode, a gate electrode, a gate dielectric, and a semiconductor layer that functions as an active channel of the FET. The active channel is configured to carry a current between the source and drain electrodes and has a conductivity that is responsive to voltages applied to the gate electrode. The gate dielectric is located between the gate electrode and the semiconductor layer and includes a quasi-1D charge or spin density wave material.

In another aspect, the invention features a method of operating a field-effect transistor with a gate electrode, a source electrode, a drain electrode, and an active semiconductor channel. The method includes establishing a current flow in the active semiconductor channel by applying a voltage across the source and drain electrodes and changing the current flow by adjusting a voltage applied to the gate electrode. The adjusting a voltage step causes a change in the strength of an electric field in a charge or spin density wave material that is located between the channel and the gate electrode.

BRIEF DESCRIPTION OF THE DRAWINGS

In the Figures and text, like reference numbers refer to elements with similar functions.

DETAILED DESCRIPTION OF ILLUSTRATIVE EMBODIMENTS

U.S. patent application Ser. No. 10/043,372 ("'372"), filed by Girsh Blumberg et al on Jan. 9, 2002, is incorporated herein by reference in its entirety.

Figure 1:
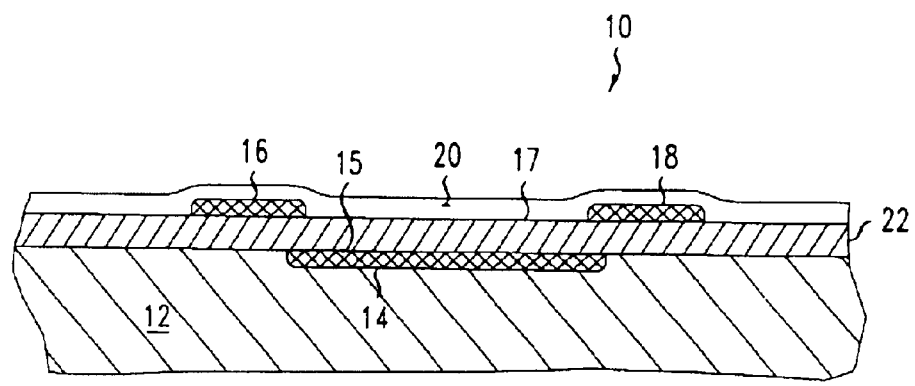
FIG. 1 is a cross-sectional view of a field-effect-transistor (FET) with an ultra-sensitive gate electrode.

FIG. 1 shows a field-effect-transistor (FET) 10 located on a dielectric or semiconductor substrate 12. The FET 12 includes a gate electrode 14, a source electrode 16, a drain electrode 18, and a semiconductor layer 20. The gate, source, and drain electrodes 14, 16, 18 are located on the same side of the semiconductor layer 20. A gate dielectric layer 22 is interposed between the gate electrode 14 and the semiconductor layer 20. The semiconductor layer 20 functions as an active channel of the FET 10, because the layer 20 is configured to carry a current between the source and drain electrodes 16, 18 and has a conductivity that is controllable by the gate electrode 14. Exemplary semiconductor layers 20 include inorganic or organic semiconductors, which are intrinsic, n-type doped, or p-type doped.

The gate electrode 14 is positioned to produce a control electric field at a portion of the semiconductor layer 20, which is located between the source and drain electrodes 16, 18. In particular, some gate voltages produce an electric field that causes the semiconductor layer 20 to be conductive to currents flowing between the source and drain electrodes 16, 18. Other gate voltages produce an electric field that cause the semiconductor layer 20 be substantially non-conductive to currents flowing between the source and drain electrodes 16, 18.

At moderate and high operating frequencies, small changes in the gate voltage produce large changes in the strength of the resulting electric field at the surface of semiconductor layer 20. In particular, small changes in the gate voltage can cause the semiconductor layer 20 to change from a conducting state to a non-conducting state thereby changing the active channel from an ON state and to an OFF state. For this reason, the FET 10 has a high sensitivity gate structure.

The high sensitivity of the gate structure results from the composition of the gate dielectric layer 22. The gate dielectric layer 22 is a crystalline or polycrystalline quasi one-dimensional (1D) material, which has a charge density wave state or spin density wave state at room temperature. The density wave state produces a dielectric constant with a large real part at moderate and high frequencies. The large real part causes small voltages at the gate electrode 14 to produce strong electric fields in the interior of the quasi 1D material. Such high interior electric fields, in turn, produce high electric fields for controlling the conductivity of the semiconductor layer 20.

The quasi-1D material of the gate dielectric layer 22 has an anisotropy axis "c" that is perpendicular both to the active semiconductor channel 20 and to surface 24 of the gate electrode 14. Along the "c" axis, the real part of the dielectric constant of the quasi-1D material is larger by a factor of 100 or more the real part of the dielectric constant along directions perpendicular to the "c" axis. For that reason, the gate electrode 14 is able to produce strong electric fields in response to small gate voltages.

Exemplary gate dielectric layers 22 are formed of crystalline or polycrystalline cuprate ladder materials that are doped with strontium (Sr) or calcium (Ca). In some doped cuprate ladder materials, sliding spin density wave states cause the dielectric constant to have a large real part at room temperature. For example, the dielectric constant of the doped cuprate ladder material $Sr_{14}Cu_{24}O_{41}$, has a very larger real part along the "c" lattice axis, i.e., the 1D anisotropy axis. Along the "c" axis, exemplary values of the real part are about $10^6$ or more. These values are $10^3$ or more times larger than the real parts of dielectric constants of other good dielectrics at room temperature. At temperatures as high as and higher than room temperature, the real part of the dielectric constant of $Sr_{14}Cu_{24}O_{41}$ has large values for a wide range of frequencies from 0 Hz to about 100 giga-Hz.

Figure 2:
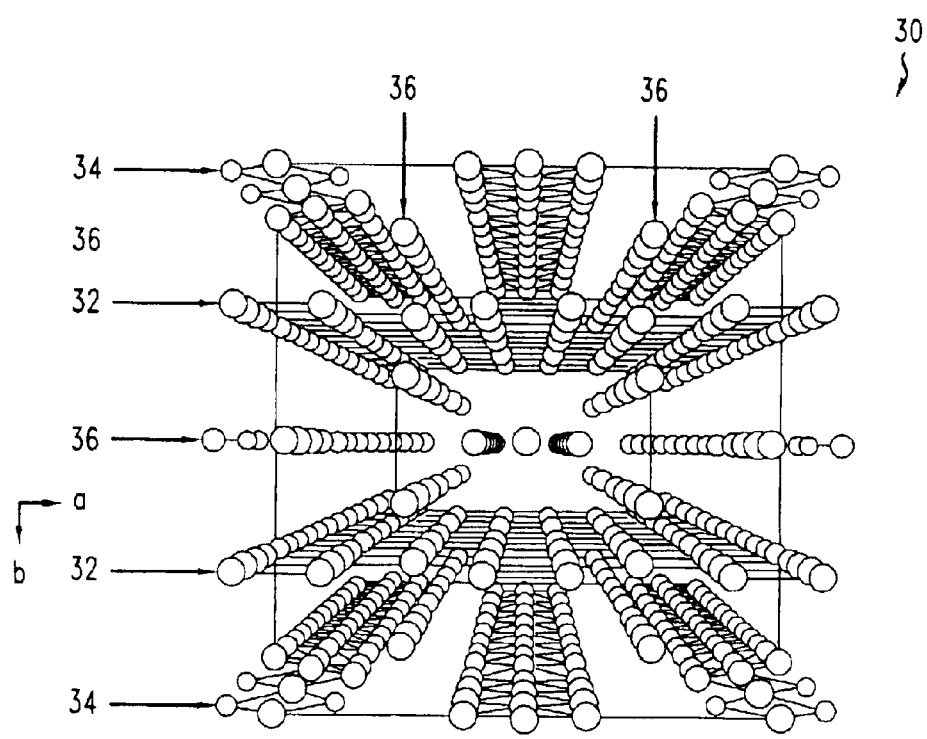
FIG. 2 is a perspective view of a doped cuprate ladder material suitable for use in a gate dielectric layer of the FET of FIG. 1.

FIG. 2 shows an exemplary doped cuprate ladder material 30 for gate dielectric layer 22 of FIG. 1. The doped cuprate ladder material 30 forms a stack of paired $Cu_2O_3$ sheets 32 and $CuO_2$ chains 34 along the crystal's "b" axis. Rows of dopant atoms 36 are located adjacent the $Cu_2O_3$ sheets 32. The relative percentages of dopant atoms 36 to copper (Cu) and oxygen (O) atoms are fixed by the crystal's stoichiometry. Exemplary cuprate ladder crystals for the gate dielectric layer 22 have stoichiometric compositions $(Sr_{14-x}Ca_x)Cu_{24}O_{41}$, i.e., Sr and/or Ca dopant atoms 36.

Figure 3C:
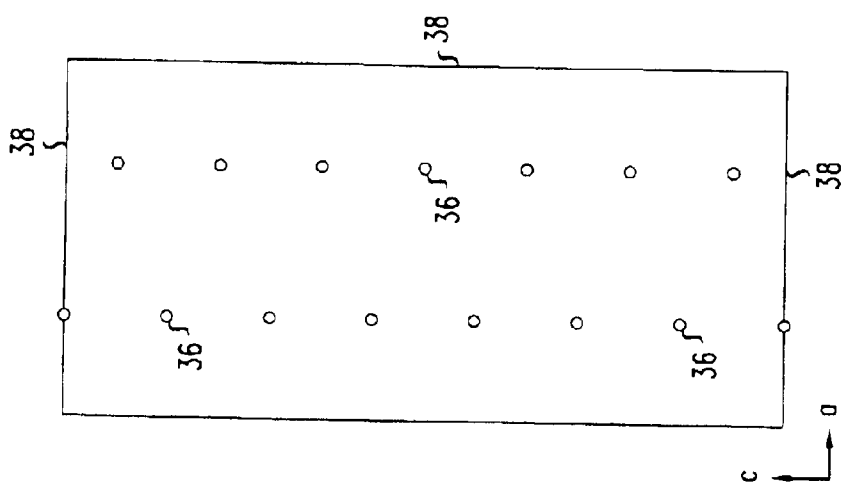
FIGS. 3a, 3b, and 3c are side views of $Cu_2O_3$ sheets, $CuO_2$ chains, and rows of Sr (strontium) or Ca (calcium) dopant atoms in one unit cell of the doped cuprate ladder material of FIG. 2.
Figure 3B:
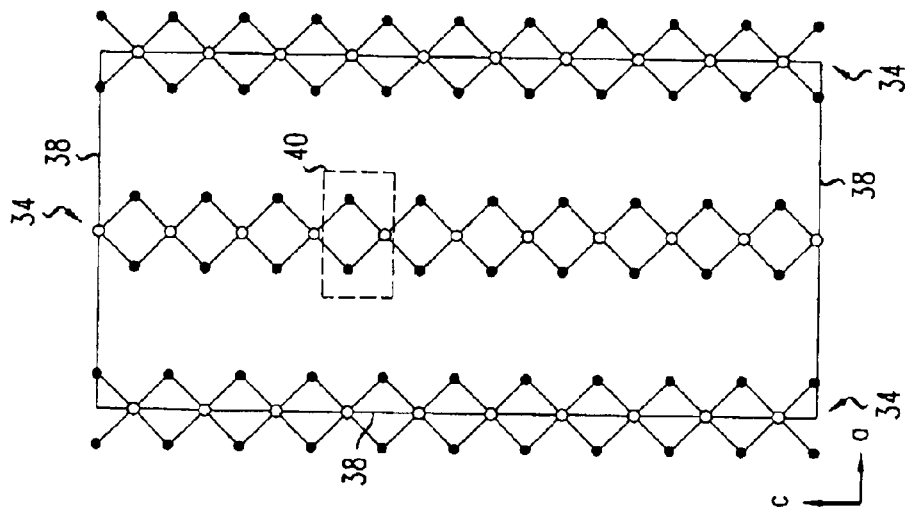
Figure 3A:
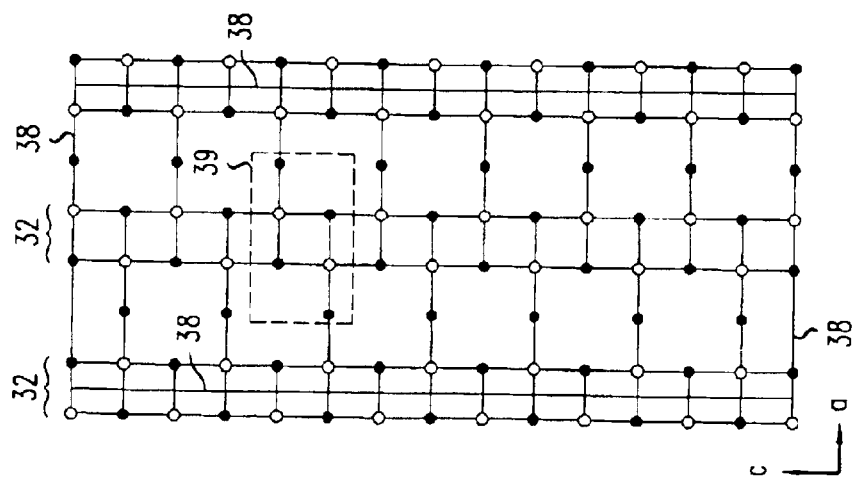

FIGS. 3a, 3b, and 3c show $Cu_2O_3$ sheets 32, $CuO_2$ chains 34, and rows of dopant atoms 36 for one unit cell 38 of cuprate ladder material 30 of FIG. 2. The $Cu_2O_3$ sheet 32 includes a ladder-like building block 39 of copper (light circles) bonded to oxygen (dark circles). In the $Cu_2O_3$ sheets 32, the ladder-like building blocks 39 link together via oxygen linkages. The $CuO_2$ chains 34 have a building block 40 of copper bonded to oxygen. The $Cu_2O_3$ sheet 32 and $CuO_2$ chain 34 have an almost commensurate structure in which 7 ladder-like blocks 39 match to 10 chain building blocks 40 along the c axis of the unit cell 38.

FIGS. 2, 3a–3c illustrate that the copper-oxygen sheets 32 fix an anisotropy axis "c" for the doped cuprate ladder material 30. Due to the copper-oxygen ladders 32, doped cuprate ladder materials behave as quasi one-dimensional (1D) materials. The 1D anisotropy of doped cuprate ladder crystal 30 causes its dielectric properties to be anisotropic. Real parts of the crystal's dielectric constant are typically a few orders of magnitude or more larger along the c-lattice and 1D anisotropy axis than along the perpendicular a- and b-lattice axes.

Referring again to FIG. 1, FETs 10 using a crystalline form of doped cuprate ladder material 30 of FIGS. 2, 3a–3c in gate dielectric layer 22, preferably orient the material's c-lattice axis substantially perpendicular to surface 15 of gate electrode 14 and to surface 17 of the active semiconductor channel. This orientation increases the strength of the effective electric field that a gate voltage will produce at the active channel of the FET 10 thereby increasing the overall sensitivity of the FET's gate structure.

Preferably the spin or charge density wave material of gate dielectric layer 22 is also in contact with surface 17 of the FET's active semiconductor channel. That is, other materials preferably are not located between the active channel portion of semiconductor layer 20 and the gate dielectric layer 22. Such contact configurations enable variations in strong electric fields inside the spin or charge density wave material to induce larger variations to the conductivity of the FET's active channel thereby making the gate structure more sensitive.

Figure 4:
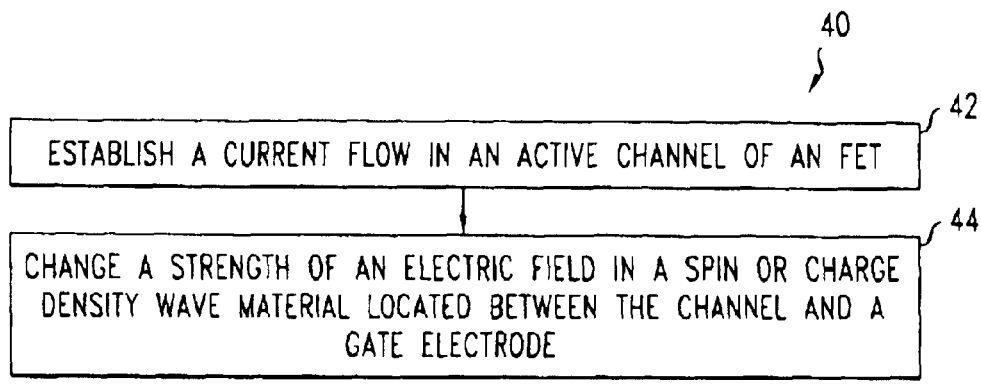
FIG. 4 is a flow chart illustrating a method of operating the FET of FIG. 1.

FIG. 4 illustrates a method for operating FET 10 of FIG. 1. The method 40 includes applying a bias voltage across the FET's active channel to establish a current flow therein (step 42). To apply the bias voltage, a voltage source is applied across source and drain electrodes 16, 18 located at opposite ends of the active channel portion of semiconductor layer 20. The method 40 includes changing the current flow in the active channel by adjusting a voltage applied to gate electrode 14 such that the strength of an electric field changes in a spin or charge density wave material that is located between the active channel and the gate electrode 14, i.e., in the material of gate dielectric layer 22 (step 44). Due to the presence of the spin or charge density wave material, the change in gate voltage produces a much larger change in the electric field inside the gate dielectric layer 22 than would otherwise be produced. This larger field change enables a smaller gate voltage change to change the conductivity state of the active channel, e.g., to switch between conducting and non-conducting channel states.

There are two methods for fabricating doped cuprate ladder materials such as $Sr_{14}Cu_{24}O_{41}$. One method produces a bulk crystal of doped cuprate ladder material, e.g., as described in the '372 application. The other method produces a film of the doped cuprate ladder material. The different methods for making the cuprate ladder material provide different embodiments of the FET 10 of FIG. 1.

Figure 5A:
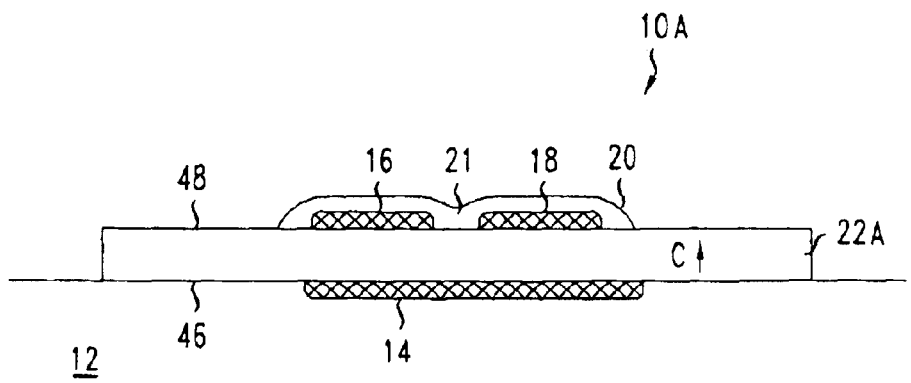
FIGS. 5A–5B show cross-sectional views of specific embodiments of the FET of FIG. 1 in which the gate dielectric layer was produced from a bulk crystal of doped cuprate ladder material.
Figure 5B:
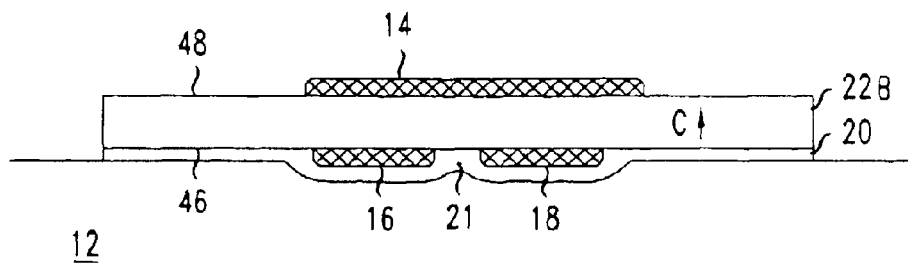

FIGS. 5A and 5B show FETs 10A, 10B, i.e., embodiments of FET 10 shown in FIG. 1. The FETs 10A, 10B were made by fabrication processes that use bulk crystals of cuprate ladder material.

Referring to FIG. 5A, the fabrication process for FET 10A uses a bulk $Sr_{14}Cu_{24}O_{41}$ crystal. One method for making such a bulk crystal is described by E. M. McCarron, III in Mat. Res. Bull. Vol. 23 (1988) page 1356, which is incorporated by reference herein in its entirety. The method includes mixing stoichiometric amounts of $SrO_2$ powder and CuO powder. The powder mixture is charged into a gold crucible and heated to a final temperature in the range of about 875° C. to 900° C. During the heating, temperatures are raised at about 5° C. per hour until the final temperature. The mixture is kept at the final temperature for about 36 hours to produce a melt, which is then cooled at a rate of about 1° C. per hour to 400° C. The melt is further cooled to about 100° C. so that the crucible can be removed to obtain the final crystal.

Another method for making single $Sr_{14}Cu_{24}O_{41}$ cuprate ladder crystals is described by Motoyama in Physical Review 55B (1997) page R3386. Motoyama's process is based on a traveling-solvent-floating-zone method described by Tanaka in Nature 337 (1989) page 21 and Kimura in J. Crystal Growth 41 (1977) 192. The articles of Motoyma, Tanaka and Kimura are incorporated by reference herein in their entirety.

The fabrication process for FET 10A includes cutting the bulk $Sr_{14}Cu_{24}O_{41}$ crystal along a plane substantially perpendicular to the crystal's "c" lattice axis. The cutting step produces a thin slice 22A of crystalline $Sr_{14}Cu_{24}O_{41}$. Exemplary slices 22A have a thickness of less than about 0.5 mm and preferably of less than about 0.05 mm. The slice 22A will function as a gate dielectric for the FET 10A.

The fabrication process for FET 10A includes evaporating a metallic gate electrode 14 onto a surface 46 of the slice 22A of crystalline $Sr_{14}Cu_{24}O_{41}$. Exemplary metals for the evaporation include gold, silver, aluminum, and copper. The metallic gate electrode 14 and dielectric slice 22A form the gate structure of the FET 10A.

In the gate structure, a normal vector to the surface of the gate electrode 14 makes a small angle with respect to the "c" lattice axis of the bulk $Sr_{14}Cu_{24}O_{41}$ crystal. The smallness of the angle results from the orientation in which the dielectric slice 22A was originally cut. The magnitude of the angle is, at least, less than 45 degrees.

The fabrication process for FET 10A includes mounting the gate structure on a substrate 12 to facilitate subsequent handling. Some processes include planarizing exposed surface 48 of the mounted gate structure, e.g., by a chemical-mechanical planarizing technique, to thin the slice 22A. Thinning the slice 22A makes the final gate structure more sensitive to applied gate voltages. The planarizing is facilitated if the gate structure is mounted in a hardenable wax. Appropriate waxes and mounting materials for planarizing are well-known to those of skill in the art.

The fabrication process includes evaporating metal source and drain electrodes 16, 18 onto exposed surface 48 of the dielectric slice 22A. The evaporation proceeds under control of a mask, e.g. a lithographically made photo-resist mask. The mask fixes lateral boundaries so that the gap between the source and drain electrodes 16, 18 is located over the gate electrode 14. The interface region of the gap with respect to slice 22A is subjected to strong electric fields during operation of the transistor.

The fabrication process includes depositing semiconductor layer 20 on surface 48 of slice 22A to form an active channel 21 between the source and drain electrodes 16, 18. Exemplary methods to deposit the layer include epitaxial growth of a layer of inorganic semiconductor and solution-based deposition of a layer of an organic semiconductor. In some embodiments, the deposition also includes diffusing or implanting n-type or p-type impurities into the semiconductor layer 20 and thermally activating the impurities. Methods for depositing and doping such semiconductor layer are well-known to those of skill in the art.

The normal to a surface of semiconductor layer 20 makes a small angle with respect to the "c" lattice axis of the bulk $Sr_{14}Cu_{24}O_{41}$ crystal due to the original cut orientation for slice 22A. The magnitude of the angle is, at least, less than 45 degrees.

Referring to FIG. 5B, the fabrication process for FET 10B also uses a bulk crystal of doped cuprate ladder material, e.g., grown via a method described in either the incorporated '372 patent application or the incorporated article of McCarron, III or Motoyama. The fabrication process for the FET 10A includes cutting a thin slice 22B from the bulk crystal of doped cuprate ladder material. The process includes performing a mask-controlled evaporation to form metal source and drain electrodes 16, 18 onto surface 46 of the slice 22B. The process includes depositing or growing a semiconductor layer 20 to form an active channel 21 having an interface with the slice 22B. The interface connects the source and drain electrodes 16, 18. The process includes mounting the resulting structure on a supportive substrate 12 to facilitate subsequent handling steps such as planarization of the slice 22B. The process also includes performing a mask-controlled evaporation to produce a metal gate electrode 14 on second surface 48 of the slice 22B. The mask aligns the gate electrode 14 to cover the area over the active channel 21 of the semiconductor layer 20.

Figure 5C:
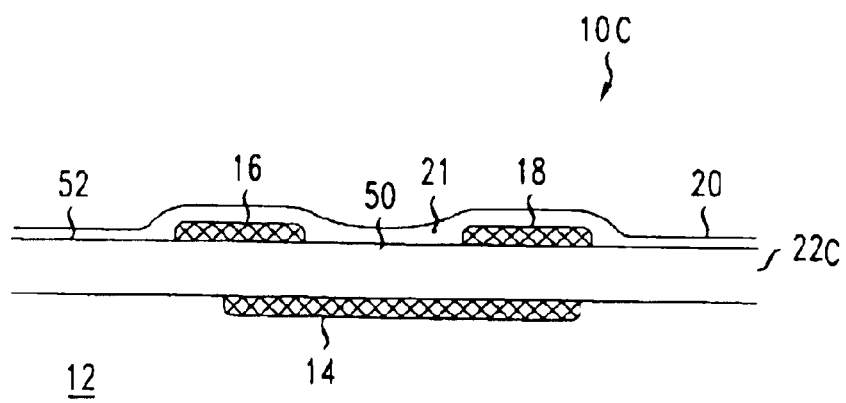
FIGS. 5C–5D show cross-sectional views of other specific embodiments of the FET of FIG. 1 in which the gate dielectric layer is a thin polycrystalline film of doped cuprate ladder material.
Figure 5D:
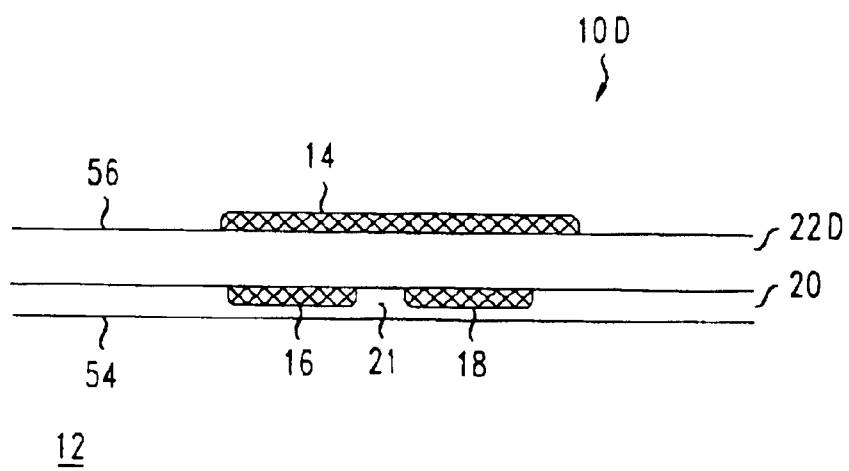

FIGS. 5C and 5D show FETs 10C, 10D made by fabrication processes that uses a thin polycrystalline films of doped cuprate ladder material.

Referring to FIG. 5C, a fabrication process for FET 10C includes forming a gate electrode 14 in substrate 12, e.g., a semiconductor or dielectric substrate. The forming step involves making either a metallic or a heavily doped semiconductor gate electrode 14. Making a gold, aluminum, or copper electrode involves processes well-known to those of skill in the art, e.g., mask-controlled etch and evaporation-depositions. Making a heavily doped semiconductor electrode involves a mask-controlled implantation or diffusion of n-type or p-type dopants into the substrate 12, i.e., a semiconductor substrate, and a subsequent thermal activation of the dopant atoms. Such methods are also well-known to those of skill in the art.

The fabrication process includes forming a film 22C of a polycrystalline doped cuprate ladder material such as $Sr_{14}Cu_{24}O_{41}$ over both gate electrode 14 and substrate 12. The film 22C will function as a gate dielectric of the FET 10C.

Due to a lattice mismatch, the film 22C will typically form as a polycrystalline layer in which "c" lattice axes of individual crystalline grains are not perpendicular to surface 50 of gate electrode 14. This lack of grain alignment somewhat lowers the effective value of the real part of the dielectric constant of the film 22C.

Though c-lattice axes of individual grains of film 22C are not completely aligned with the direction of electric fields that will be produced by gate electrode 14, the film 22C is very thin. Exemplary films 22C are less than 10 micrometers thick and are preferably less than about 1 micrometer thick. Such films 22C are much thinner than slices 22A, 22B formed by cutting bulk crystals of doped cuprate ladder materials. Due to its thinness, the film 22C typically produces a more sensitive gate structure than those formed from the slices 22A, 22B of FIGS. 5A–5B.

Y. Furubayashi et al describe a method for forming films of doped cuprate ladder materials similar to those of the film 22C of FIG. 5C. The method of Furubayashi et al is described in an article published at Phys. Rev. B 60 (1999), pages R3720–R3723. This article is incorporated herein by reference in its entirety.

One method for forming film 22C from a material such as $Ca_xSr_{14-x}Cu_{24}O_{41}$ involves a pulsed laser deposition. Prior to performing the deposition, a solid pellet is prepared for use as a laser target. Preparation of the pellet involves forming a mixture of powdered $CaCO_3$, $SrCO_3$ and $CuO$, compressing the mixture into a pellet having a diameter of about 20 millimeters, and sintering the pellet for about 60 hours at about 780° C. in a flowing $O_2$ atmosphere. The starting mixture is slightly enriched in Sr and/or Ca with respect to Cu. For example, a starting mixture for making a film of $Sr_{14}Cu_{24}O_{41}$, has Sr and Cu at a stoichiometric ratio between about $14/24$ and $14/26$. The deposition of the film 22C involves using laser pulses to eject material from the pellet under conditions that form a film of the ejected material on substrate 12 and gate electrode 14. Typical deposition conditions involve using a pulsed KrF excimer laser with a wavelength of about 248 nanometers and a pulse rate of about 1 Hertz. The deposition conditions include maintaining the substrate at a temperature of about 600° C. and maintaining an oxygen pressure of about $1.6 \times 10^2$ Pa. These conditions are expected to deposit material at a rate of about 0.1 nanometers per second and to form final films with a thickness of about 100 nanometers or more.

The fabrication process includes performing an evaporation-deposition of gold, aluminum, or copper source and drain electrodes 16, 18 on an exposed surface 52 of the film 22C of doped cuprate ladder material. During the evaporation a mask controls feature details of the forming electrodes 16, 18.

The fabrication process also includes depositing a semiconductor layer 20 on exposed surface 52 of the film 22C thereby forming an active semiconductor channel 21 between source and drain electrodes 16, 18. Exemplary methods for forming the semiconductor layer 20 have already been described with respect to above FIG. 5A. The semiconductor layer 20 may be doped with n-type or p-type dopants.

Both active channel 21 and source and drain electrodes 16, 18 form interfaces with film 22C of doped cuprate ladder material. This enables the interfacial region of the active channel 21, which is sensitive to strong electric fields in the film 22C, to also form a conduction channel between the source and drain electrodes 16, 18. The sensitivity of the interfacial region causes the conduction properties of the FET 10C to be ultra-sensitive to the voltage applied to gate electrode 14.

Referring to FIG. 5D, a fabrication process for FET 10D is illustrated. The process includes depositing a semiconductor layer 20 on surface 54 of the substrate 12. The process includes forming metallic or heavily doped semiconductor source and drain electrodes 16, 18 such that active channel portion 21 of the semiconductor layer 20 connects the source and drain electrodes 16, 18. The fabrication process includes growing a film 22D of doped cuprate ladder material over semiconductor layer 20 and electrodes 16, 18, e.g., by a method already described with respect to FIG. 5C. The dielectric film 22D contacts both the channel portion 21 and source and drain electrodes 16, 18. The fabrication process also includes performing an evaporation-deposition of a gold, aluminum, or copper gate electrode 14 on exposed surface 56 of the film 22D. A mask controls the evaporation so that the gate electrode 14 is aligned over the active channel portion 21 of the semiconductor layer 20.

From the disclosure, drawings, and claims, other embodiments of the invention will be apparent to those skilled in the art.

What is claimed is:

1. A field-effect transistor, comprising:
   gate, source, and drain electrodes;
   a semiconductor layer being located to function as an active channel of the transistor, the active channel being configured to carry a current between the source and drain electrodes and having a conductivity responsive to voltages applied the gate electrode; and
   a gate dielectric comprising a quasi-1D charge or spin density wave material and being located between the gate electrode and the semiconductor layer.

2. The transistor of claim 1, wherein the quasi-1D charge or spin density wave material is crystalline has a 1D anisotropy axis, the axis making an angle with a normal vector to a surface of the semiconductor layer, the angle having a magnitude of less than 45 degrees.

3. The transistor of claim 1, wherein the quasi-1D charge or spin density wave material is in contact with the semiconductor layer.

4. The transistor of claim 1, wherein the quasi-1D charge or spin density wave material comprises a cuprate material.

5. The transistor of claim 4, wherein the cuprate material is a polycrystalline film.

6. The transistor of claim 4, wherein the cuprate material is crystalline and has a "c" lattice axis, the axis making an angle with the normal vector to a surface of the semiconductor layer, the angle having a magnitude of less than 45 degrees.

7. The transistor of claim 4, wherein the cuprate material comprises one of strontium dopant atoms and calcium dopant atoms.

8. The transistor of claim 7, wherein the cuprate material comprises $Sr_{14}Cu_{24}O_{41}$.

9. A field effect transistor, comprising:
   gate, source, and drain electrodes;
   a semiconductor layer configured to function as an active channel of the field-effect transistor, the active channel being able to conduct a current between the source and drain electrodes;
   a gate dielectric comprising a cuprate ladder material and being located between the gate electrode and the semiconductor layer.

10. The transistor of claim 9, wherein, the cuprate material has a "c" lattice axis, the axis making an angle with a normal vector to a surface of the semiconductor layer, the angle having a magnitude of less than 45 degrees.

11. The transistor of claim 9, wherein the cuprate material is in contact with the channel.

12. The transistor of claim 9, wherein the cuprate material forms a polycrystalline film.

13. The transistor of claim 9, wherein the cuprate material comprises one of strontium dopant atoms and calcium dopant atoms.

14. The transistor of claim 13, wherein the cuprate material comprises $Sr_{14}Cu_{24}O_{41}$.

15. A method of operating a field-effect transistor, the transistor having a gate electrode, a source electrode, a drain electrode, and an active semiconductor channel, the method comprising:
   establishing a current flow in the active semiconductor channel by applying a voltage across the source and drain electrodes; and
   changing the current flow by adjusting a gate voltage such that an electric field strength changes in a charge or spin density wave material located between the channel and the gate electrode.

16. The method of claim 15, wherein the charge or spin density wave material is a cuprate ladder material located to function as a gate dielectric layer.

17. The method of claim 16, wherein the cuprate ladder material is in contact with the semiconductor channel.

* * * * *